(12) United States Patent
Matsumoto et al.

(10) Patent No.: US 10,175,898 B2
(45) Date of Patent: Jan. 8, 2019

(54) SEMICONDUCTOR DEVICE AND METHOD OF CONTROLLING SEMICONDUCTOR DEVICE

(71) Applicant: TOSHIBA MEMORY CORPORATION, Tokyo (JP)

(72) Inventors: Hajime Matsumoto, Higashimurayama Tokyo (JP); Toyokazu Eguchi, Inagi Tokyo (JP); Hitoshi Yagisawa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/000,087

(22) Filed: Jun. 5, 2018

(65) Prior Publication Data

US 2018/0285001 A1    Oct. 4, 2018

Related U.S. Application Data

(63) Continuation of application No. 15/426,267, filed on Feb. 7, 2017, now Pat. No. 10,001,936.

(30) Foreign Application Priority Data

Aug. 9, 2016    (JP) .................................. 2016-156676

(51) Int. Cl.
*G11C 16/34*     (2006.01)
*G06F 3/06*      (2006.01)
(Continued)

(52) U.S. Cl.
CPC .......... *G06F 3/0619* (2013.01); *G06F 3/0634* (2013.01); *G06F 3/0679* (2013.01);
(Continued)

(58) Field of Classification Search
CPC .... G06F 3/0619; G06F 3/0634; G06F 3/0679; G06F 11/0727; G06F 11/0793; G11C 16/30
(Continued)

(56) References Cited

U.S. PATENT DOCUMENTS 5,300,765 A    4/1994 Mizuta
5,361,228 A    11/1994 Adachi et al.
(Continued)

FOREIGN PATENT DOCUMENTS

JP    H09163590 A    6/1997
JP    2010119262 A    5/2010

*Primary Examiner* — Pho M Luu
*Assistant Examiner* — Xiaochun L Chen
(74) *Attorney, Agent, or Firm* — Patterson & Sheridan, LLP

(57) ABSTRACT

A semiconductor device includes a connector connectable to a host, a power supply circuit which includes an input portion that receives first power from the host via the connector, an output portion, and a switch that is connected to the input portion and the output portion and controls whether to supply the first power to the output portion, the power supply circuit generating second power and third power from the first power, a semiconductor memory which receives the second power from the output portion, and a controller which receives the third power from the output portion and controls the semiconductor memory. The power supply circuit turns off the switch and stops supply of power to the semiconductor memory and the controller when the second power exceeds a first value or when the third power exceeds a second value.

18 Claims, 3 Drawing Sheets

(51) Int. Cl.
*G06F 11/07* (2006.01)
*G11C 16/30* (2006.01)

(52) U.S. Cl.
CPC ...... *G06F 11/0727* (2013.01); *G06F 11/0754* (2013.01); *G06F 11/0793* (2013.01); *G11C 16/30* (2013.01); *G11C 16/3495* (2013.01)

(58) Field of Classification Search
USPC .......................................................... 365/226
See application file for complete search history.

(56) References Cited

U.S. PATENT DOCUMENTS

| | | | |
|---|---|---|---|
| 5,959,926 A * | 9/1999 | Jones | G11C 5/14 326/80 |
| 6,557,106 B1 * | 4/2003 | Yuzawa | G06F 1/305 713/300 |
| 7,064,994 B1 * | 6/2006 | Wu | G06F 1/206 365/211 |
| 7,907,378 B2 | 3/2011 | Julicher | |
| 8,432,647 B2 | 4/2013 | Knott et al. | |
| 2008/0151456 A1 | 6/2008 | Julicher | |
| 2010/0123979 A1 | 5/2010 | Naito et al. | |

* cited by examiner

SEMICONDUCTOR DEVICE AND METHOD OF CONTROLLING SEMICONDUCTOR DEVICE

CROSS-REFERENCE TO RELATED APPLICATIONS

This application is a continuation of U.S. patent application Ser. No. 15/426,267, filed on Feb. 7, 2017, which is based upon and claims the benefit of priority from Japanese Patent Application No. 2016-156676, filed on Aug. 9, 2016, the entire contents of which is incorporated by reference.

FIELD

Embodiments disclosed therein relate to a semiconductor device and a method of controlling a semiconductor device.

BACKGROUND

A semiconductor device in which a power supply circuit including a power supply IC is supplied with power from a host and supplies power (voltages) to a controller, a NAND memory, and the like is known.

It is preferable that a semiconductor device including a power supply circuit can improve convenience for a user.

BRIEF DESCRIPTION OF THE DRAWINGS

FIG. 1A is a top view, FIG. 1B is a side view, and FIG. 1C is a bottom view;

DETAILED DESCRIPTION

Figures 1A, 1B, 1C:
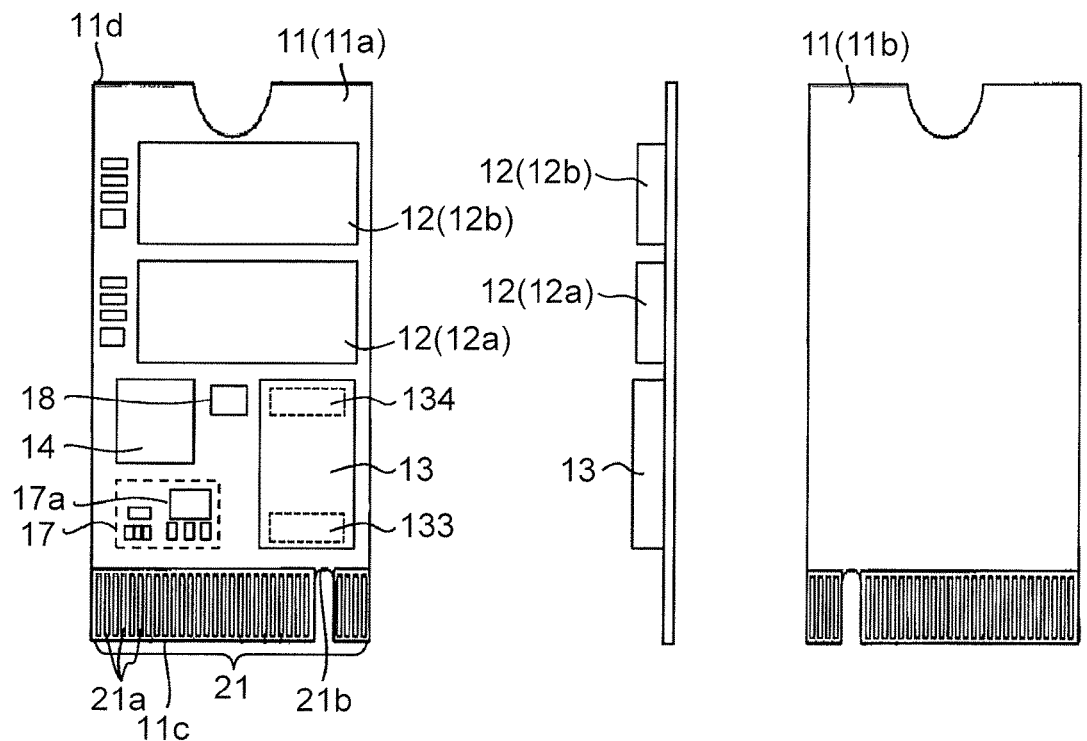
FIGS. 1A to 1C are diagrams illustrating an example of an appearance of a semiconductor device according to a first embodiment, where

Hereinafter, embodiments will be described with reference to the accompanying drawings.

In this specification, some elements are referenced by plural expression examples. The expression examples are merely exemplary, and do not deny that the elements can be expressed by other expressions. Elements which are not referenced by plural expressions may be expressed by other expressions.

The accompanying drawings are schematic, and relationships of thicknesses and two-dimensional sizes, ratios of thicknesses of layers, and the like may be different from real ones. Parts having different dimensional relationships and ratios may be included in the drawings.

First Embodiment

FIGS. 1A to 1C illustrate an example of an appearance of a semiconductor device 1 according to an embodiment. FIG. 1A is a plan view, FIG. 1B is a bottom view, and FIG. 1C is a side view.

Figure 2:
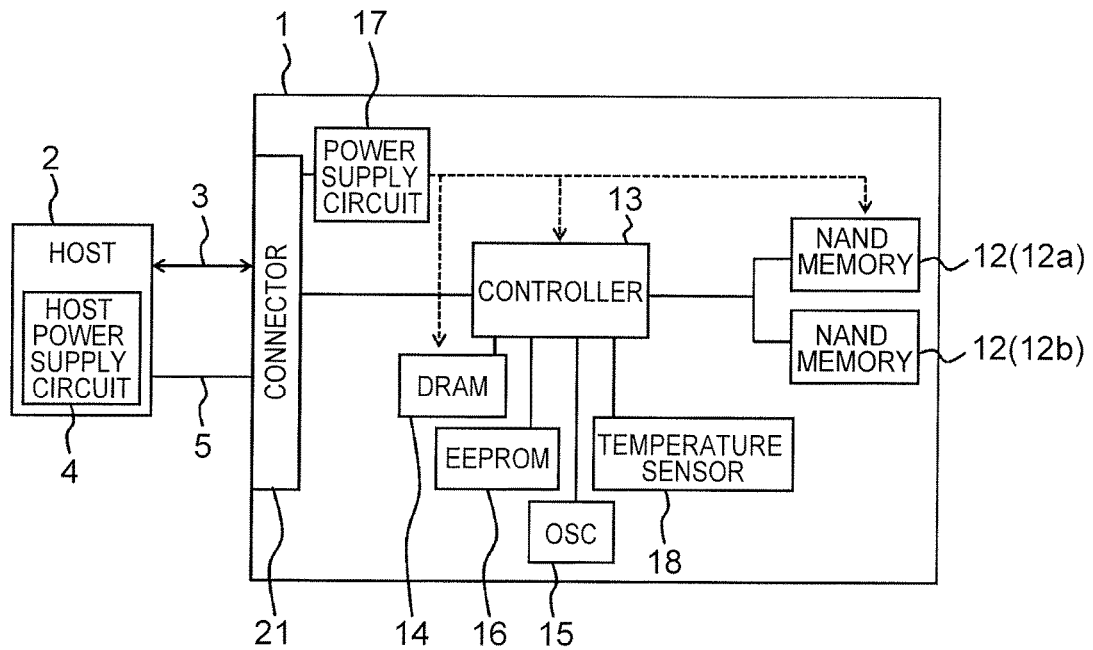
FIG. 2 is a diagram illustrating an example of a system configuration of the semiconductor device according to the first embodiment.

FIG. 2 illustrates an example of a system configuration of the semiconductor device 1 according to a first embodiment.

The semiconductor device according to this embodiment is a memory system such as a solid state drive (SSD), but is not limited thereto.

As illustrated in FIG. 2, the semiconductor device 1 is connected to a host 2. In this embodiment, the host 2 may be various electronic devices such as a notebook portable computer, a tablet terminal, detachable notebook PC, and a mobile phone. The host 2 may be a server device which is used for a data center or the like. The semiconductor device 1 can be used as an external memory of the host 2.

As illustrated in FIGS. 1A to 1C and FIG. 2, the semiconductor device 1 includes a substrate 11, a nonvolatile memory 12, a controller 13, a volatile memory 14 that can operate faster than the nonvolatile memory 12, an oscillator (OSC) 15, an electrically erasable and programmable ROM (EEPROM) 16, a power supply circuit 17, a temperature sensor 18, and other electronic components such as a resistor and a capacitor. In FIGS. 1A to 1C, the oscillator 15 and the EEPROM are not illustrated for the purpose of convenience of explanation.

The nonvolatile memory 12 is, for example, a NAND type flash memory (hereinafter, abbreviated to a NAND memory). In the following description, the nonvolatile memory 12 is referred to as a "NAND memory 12," but the nonvolatile memory is not limited thereto and may be other nonvolatile memories such as a magnetoresistive random access memory (MRAM).

The volatile memory 14 is, for example, a dynamic random access memory (DRAM). In the following description, the volatile memory 14 is referred to as a "DRAM 14," but the volatile memory 14 is not limited thereto and may be other volatile memories.

The NAND memory 12 and the controller 13 in this embodiment are respectively mounted as a semiconductor package which is an electronic component. For example, as the semiconductor package of the NAND memory 12, plural semiconductor chips (memory chips) are stacked and encapsulated in a single package.

The substrate 11 is, for example, a substantially rectangular circuit board formed of a material such as a glass epoxy resin and defines external dimensions of the semiconductor device 1. The substrate 11 has a first surface 11$a$ and a second surface 11$b$ which is located opposite to the first surface 11$a$. The first surface 11$a$ and the second surface 11$b$ may be referred to as, for example, principal surfaces. In this specification, surfaces other than the first surface 11$a$ and the second surface 11$b$ among surfaces of the substrate 11 are defined as "side surfaces." In the semiconductor device 1, the first surface 11$a$ is a component-mounting surface on which the NAND memory 12 (12$a$ and 12$b$), the controller 13, the DRAM 14, the oscillator 15, the EEPROM 16, the power supply circuit 17, the temperature sensor 18, and other electronic components such as resistors and capacitors are mounted. The second surface 11$b$ is a non-mounting surface on which the components such as the NAND memory 12 are not mounted. Since no component is mounted on the second surface, a decrease in thickness of the semiconductor device 1 and space saving can be achieved, thus a decrease in size and thickness of the host 2 in which the semiconductor device 1 is mounted can be achieved.

In the semiconductor device 1, components such as the NAND memory 12 may be mounted on the second surface 11*b*. Other functions such as test pads for checking performance of a product may be provided on the second surface 11*b*.

As illustrated in FIGS. 1A to 1C, the substrate 11 includes a first edge portion 11*c* and a second edge portion 11*d* which is located opposite to the first edge portion 11*c*. The first edge portion 11*c* includes a connector 21 (an interface portion, a substrate interface portion, a terminal portion, or a connection portion). The connector 21 includes, for example, plural connection terminals 21*a* (metal terminals). The connector 21 is electrically connected to the host 2 and exchanges signals (control signals and data signals) with the host 2.

The semiconductor device 1 is electrically connected to the host 2 via an interface 3. The host 2 performs data access control on the semiconductor device 1 and performs writing, reading, and erasing of data with respect to the semiconductor device 1, for example, by transmitting a writing request, a reading request, and an erasing request to the semiconductor device 1.

The semiconductor device 1 is electrically connected to a host power supply circuit 4 (a power supply circuit) via a power supply line 5. The host power supply circuit 4 provides various types of power, which are used for the semiconductor device 1, via the power supply line 5 and the connector 21.

An interface 2 according to this embodiment is, for example, peripheral component interconnect express (PCIe (PCI-E)). That is, a high-speed signal (a high-speed differential signal) based on the PCIe standard is transmitted between the connector 21 and the host 2.

The interface 2 may employ other standards such as serial attached SCSI (SAS), serial advanced technology attachment (SATA), nonvolatile memory express (NVMe), and universal serial bus (USB).

In the connector 21, a slit 21*b* is formed at a position departing from the central position in the short-side direction of the substrate 11 and is fitted to a protrusion or the like disposed in the connector side of the host 2. Accordingly, the semiconductor device 1 can be prevented from being reversely attached.

The power supply circuit 17 in the semiconductor device 1 is electrically connected to the host power supply circuit 4 via the connector 21 and the power supply line 5. The power supply circuit 17 is supplied with power required for the semiconductor device 1 from the host power supply circuit 5. The power supply circuit 17 supplies power to the NAND memory 12, the controller 13, and the DRAM 14. It is preferable that the power supply circuit 17 be disposed in the vicinity of the connector 21 to suppress a loss of power supplied from the host 2.

The power supply circuit 17 includes a power supply IC 17*a* (FIG. 1A), and electronic components such as resistors, capacitors, and inductors are connected to the power supply IC 17*a*. The power supply IC 17*a* will be described later. The power supply IC 17*a* may be referred to as a power supply circuit, a power supply chip, or a complex power supply control IC and the power supply IC 17*a* is, for example, a power management integrated circuit (PMIC).

The power supply IC 17*a* according to this embodiment is, for example, a wafer level chip size package (WLCSP) and at least one chip is packaged (encapsulated). The power supply IC 17*a* is not limited thereto.

The controller 13 controls the operation of the NAND memory 12. That is, the controller 13 controls writing, reading, and erasing of data in the NAND memory 12. The controller 13 controls a garbage collection process or a wear levelling process in the NAND memory 12.

The garbage collection process is a process of transferring data other than unnecessary data in a physical block to another physical block and releasing the original physical block to efficiently use an area in the physical block of the NAND memory 12 to which unnecessary (invalid) data had been written. In other words, the garbage collection process is a process of writing (copying) valid data in a physical block to another physical block and erasing all data in the original physical block.

The wear levelling process is a process of uniformly distributing the number of rewriting times to blocks. For example, the wear levelling process is a process of transferring data of a block having a large number of rewriting times to another block having a small number of rewriting times. By transferring data which is often rewritten to a block having a small number of rewriting times and transferring data which is less rewritten, such as an OS file of a computer, to a block having a large number of rewriting times, the number of rewriting times may be equalized in blocks. The details of the wear levelling process are not limited thereto.

In this embodiment, the garbage collection process or the wear levelling process is performed with a predetermined cycle, but it is not limited thereto and the process may be performed in accordance with a command from the host 2 or the process may be performed at each time when writing, reading or erasing of data in the NAND memory 12 corresponding to the command from the host 2 is finished.

The controller 13 includes a reset input, performs initialization (reset) of the state of the controller 13 or release of a reset state in response to an input signal, and starts normally (safely) the semiconductor device 1 as a system. The signal which is used to release the reset state is referred to as, for example, POWER ON RESET. In the following description, "switch to a reset state" includes a case in which an original reset state is maintained.

The DRAM 14 is an example of a volatile memory as described above and is used to store management information of the NAND memory 12, or to cache data and the like. The oscillator 15 supplies an operation signal of a predetermined frequency to the controller 13. The EEPROM 16 stores a control program and the like as fixed information.

The temperature sensor 18 monitors, for example, the temperature of the controller 13. The temperature sensor 18 is disposed, for example, in the vicinity of the controller 13 on the substrate 11, but the position of the temperature sensor 18 is not limited thereto. The temperature sensor 18 does not need to be disposed on the substrate 11 and may be disposed as one function of the controller 13.

The temperature sensor 18 measures the temperature around the position at which the temperature sensor 18 is disposed, but the temperature measured by the temperature sensor 18 may be referred to as the "temperature of the semiconductor device 1." When the temperature sensor 18 is disposed in the vicinity of the controller 13, the temperature measured by the temperature sensor 18 may be referred to as the "temperature of the controller 13."

When all components mounted on the substrate 11 are disposed on only the first surface 11*a* as described above, the second surface 11*b* is a component-non-mounting surface on which no component is mounted. In this case, in comparison with a case in which a mounted component protruding from the surface are mounted on both surfaces of the substrate 11, it is possible to achieve a decrease in thickness of the semiconductor device 1 and to achieve a decrease in size and thickness of the host 2 on which the semiconductor device 1 is mounted.

Figure 3:
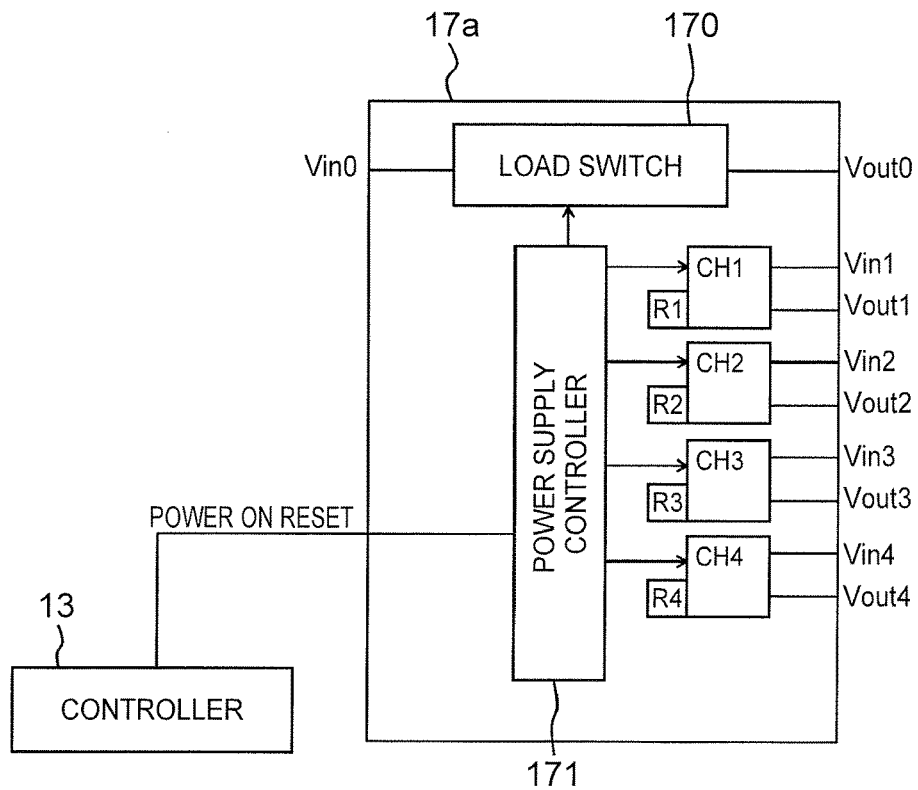
FIG. 3 is a block diagram illustrating a configuration of a power supply IC according to the first embodiment.
Figure 4:
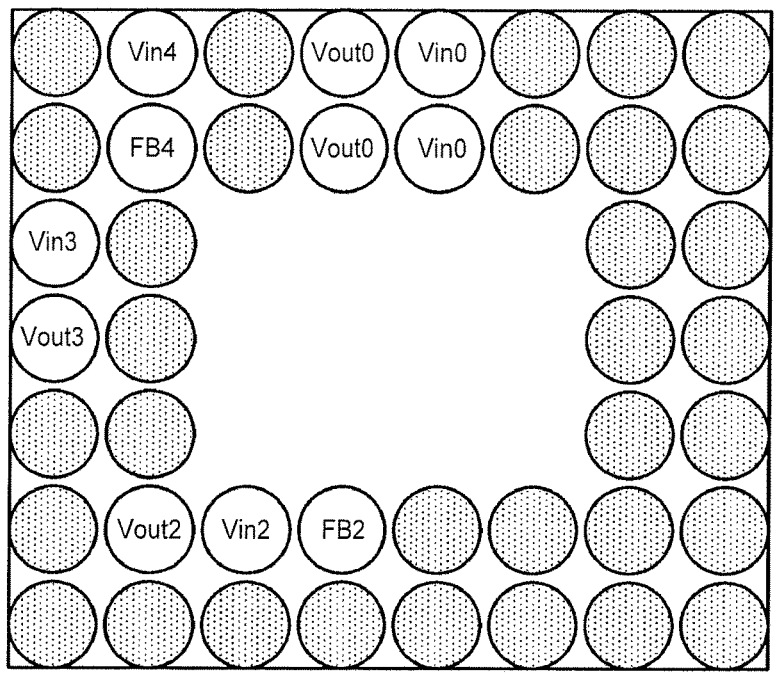
FIG. 4 is a diagram illustrating an example of a ball arrangement of a package of the power supply IC according to the first embodiment.

FIG. 3 is a block diagram illustrating a configuration of the power supply IC 17a according to this embodiment. FIG. 4 is a diagram illustrating an example of a ball arrangement (a solder ball arrangement) of the package of the power supply IC 17a according to this embodiment. The power supply IC 17a according to this embodiment includes a load switch 170 (switch), a power supply controller 171, and plural power supply channels CH1 to CH4. Each power supply channel may be merely referred to as a power supply. The number of power supply channels is not limited thereto.

An input (an input portion) Vin0 of the load switch 170 is connected to the host 2 (specifically, the host power supply unit 4) via a wire (such as a wiring layer or an internal wire) disposed in the substrate 11, the connector 21, and the power supply line 5. The input Vin0 of the load switch 170 is supplied with power (first power) from the host power supply circuit 4.

An output (output portion) Vout0 of the load switch 170 is electrically connected to inputs Vin1 to Vin4 of the power supply channels CH via the outside of the power supply IC 17a. In other words, power is supplied from the output Vout0 of the load switch 170 to the power supply channels CH of the power supply IC 17a via a wire (a wiring layer, an internal wire) disposed in the substrate 11.

On the other hand, when the load switch 170 is switched to an OFF state, the supply of power to the power supply channels CH is stopped (or intercepted or interrupted).

In this embodiment, the power supply channel CH1 is, for example, a low drop out (LDO). The power supply channels CH2 to CH4 are, for example, DC/DC converters. The power supply channels CH1 to CH4 include registers R1 to R4, respectively.

The LDO is a linear regulator and is a circuit system that converts input power into desired output power by forcibly consuming the input power using ON-resistance of a power device (a pass transistor) such as a power metal oxide semiconductor field effect transistor (power MOSFET) or a power transistor. The LDO means that it operates as a regulator even when a potential difference between the input and the output thereof is small.

The DC/DC converter is a switching regulator, and serves as a DC power supply which switches an input voltage, outputs a switching pulse, and smooth the output pulse using a filter including an inductor and a coil.

In this embodiment, the output Vout2 of the power supply channel CH2 is connected to the controller 13 and supplies a predetermined voltage (third power) to the controller 13. The output Vout3 of the power supply channel CH3 is connected to the DRAM 14 and supplies a predetermined voltage to the DRAM 14. The output Vout4 of the power supply channel CH4 is connected to the NAND memory 12 and supplies a predetermined voltage (second power) to the NAND memory 12. The types or connections of the power supply channels CH are not limited to the above description, but can be appropriately changed.

The power supply channels CH1 to CH4 have an overvoltage protection function. The overvoltage protection function may be referred to as an OVP function. Hereinafter, the overvoltage protection function will be described as OVP function.

In this embodiment, the OVP function works (starts) when the output voltage of each power supply channel CH is greater than a predetermined value (a threshold value). More specifically, for example, when the output voltage Vout of the power supply channel CH1 is greater than a predetermined value Vth, the OVP function of the power supply channel CH1 works. The OVP function works, for example, when the input and the output of each power supply channel CH are short-circuited and an overvoltage is input to the output side.

The register R of each power supply channel CH stores a monitoring result concerning whether or not the above-mentioned OVP function in each power supply channel CH works. In this embodiment, in a state in which the OVP function does not work (an initial state), "1" is held (record, set) in each register R. On the other hand, "0" is held (record, set) in the register R of each power supply channel CH in which the OVP function works. The registers R may be referred to as, for example, "POWER GOOD (PG) register." Each register R may be configured to always monitor the corresponding power supply channel CH or may be configured to monitor the corresponding power supply channel CH periodically (for example, for each cycle T1).

"0" may be held (record, set) in each register R in a state in which the OVP function does not work, and "1" may be held (record, set) in the register R of the power supply channel CH of which the OVP function works. Information stored in the registers is not limited to the above description, but at least information indicating whether the OVP function of the corresponding power supply channel CH works is stored.

The power supply controller 171 controls ON/OFF of the load switch 170. The power supply controller 171 monitors the registers R of the power supply channels CH1 to CH4. The power supply controller 171 switches the load switch 170 to OFF when any value of the registers R1 to R4 to be monitored is changed from "1" to "0," that is, when the OVP function of any power supply channel CH works. The power supply controller 171 stops the supply of power to each power supply channel (each power supply) by turning off the load switch 170. When the OVP function of any power supply channel CH works, the power supply controller 171 may reset the controller 13.

The power supply controller 171 may always monitor the registers R or may monitor the register R periodically (for example, for each cycle T2).

Figure 5:
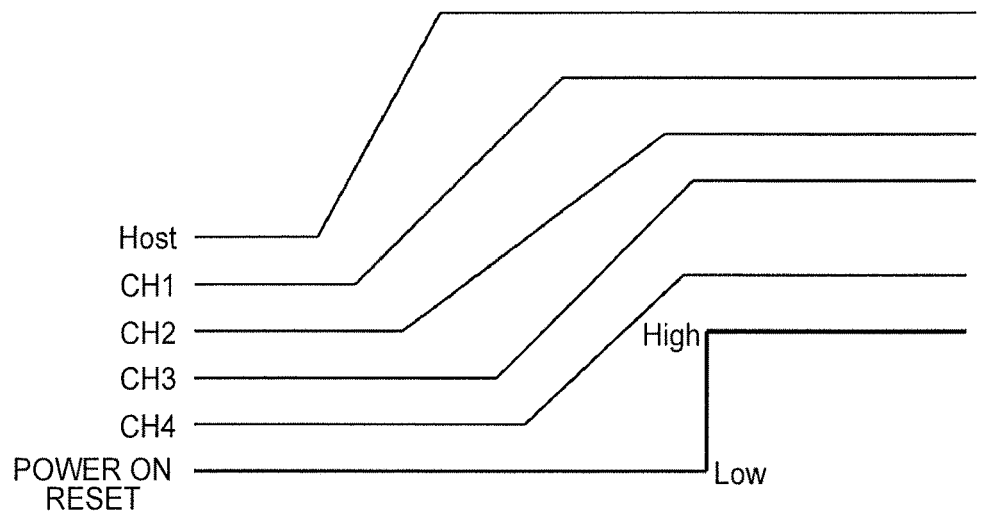
FIG. 5 is a sequence diagram of the first embodiment illustrating power when a reset state of a controller is released.

On the other hand, the power supply IC 17a includes a POWER ON RESET output. The POWER ON RESET output according to this embodiment is changed from LOW to HIGH when the power supply IC 17a is supplied with power from the host power supply unit 4 and the output voltages of all the power supply channels CH1 to CH4 are stabilized. A sequence diagram at this time is illustrated in FIG. 5. The controller 13 releases its reset state in response to the POWER ON RESET output and starts normally (safely) the system of the semiconductor device 1. The sequence illustrated in FIG. 5 can be realized, for example, by a logic circuit but the embodiment is not limited thereto.

In the semiconductor device 1 according to this embodiment having the above-mentioned configuration, when the output voltages of all the power supply channels CH1 to CH4 are stabilized, the POWER ON RESET output is switched from LOW to HIGH and the reset state of the controller 13 is released.

For the purpose of comparison, a case in which a reset IC or a CR reset circuit which is externally attached (outside the power supply IC 17a) is used to release the reset state of the controller 13 is considered. The power supply channels CH output the voltages when power is supplied to the power supply IC 17a from the host power supply unit 4, but the times required for stabilizing the output voltages thereof may be different from each other. Accordingly, when the reset IC or the CR reset circuit independent of the power supply IC 17a is used, the time after power is supplied to the semiconductor device 1 from the host power supply circuit 4 until a signal for releasing the reset state of the controller 13 is output needs to be set to be long.

Therefore, in this embodiment, the POWER ON RESET output is switched from LOW to HIGH to release the reset state of the controller 13 by the function of the power supply IC 17a as described above. Accordingly, it is possible to release the reset state of the controller 13 rapidly after the output voltages of all the power supply channels CH1 to CH4 are stabilized, thereby contributing to shortening of a system starting time.

The operation of the semiconductor device 1 according to this embodiment when the OVP function of the power supply channel CH2 works will be described below. When the output Vout2 of the power supply channel CH2 is greater than the predetermined value Vth, the OVP function of the power supply channel CH2 works. The register R2 sets (changes) its value from "1" to "0" in response to the working of the OVP function of the power supply channel CH2.

Then, the power supply controller 171 monitoring the register R2 checks that the value of the register R2 is "0" and switches the load switch 170 from ON to OFF. In this way, it is possible to stop the supply of power to each power supply channel CH when the output Vout2 of the power supply channel CH2 is an overvoltage.

For example, when a protection circuit designed to open its output side if the OVP function works is used, the input voltage is output continuously without any change, thus a component located in a power supply destination has a possibility to be affected. When a protection circuit designed to be short-circuited to the ground (GND) using a switching element such as a MOSFET if the OVP function works, is used, an overcurrent may continue to flow in the switching element to destroy the power supply IC 17a.

As illustrated in FIG. 4, in the power supply IC 17a, an input pin (terminal, electrode, or ball) Vin and an output pin (terminal, electrode, or ball) Vout of load switch 170 and each power supply channel CH, and an output feedback pin (terminal, electrode, or balls) FB are arranged to be close to each other. The ball pitch is small (for example, 0.4 mm) for the purpose of an increase in the number of power supply channels and a decrease in the size of the power supply IC 17a. Accordingly, when a stress is externally applied or when conductive substance is interposed between the balls, the input pin and the output pin may short-circuit. FIG. 4 illustrates a part of the pin arrangement. The feedback pin FB may be internally connected to the input pin Vin of the corresponding power supply channel CH and used as an auxiliary input pin of an external output Vout0 of the load switch 170, or may be used as a signal output pin from the power supply controller 171 to the controller 13.

Therefore, in the power supply IC 17a according to this embodiment, when the input and the output of any power supply channel CH are short-circuited or the like and an overvoltage is input to the output side, the load switch 170 is turned off by the power supply controller 171. Accordingly, each power supply channel CH is not supplied with power.

Accordingly, it is possible to prevent an overvoltage from being applied to the components (such as the NAND memory 12, the controller 13, and the DRAM 14) connected to the output side of the power supply channels CH. Even when it is short-circuited to the ground, it is also possible to prevent an overcurrent from continuously flowing in the switching element to destroy the power supply IC 17a.

Second Embodiment

Figure 6:
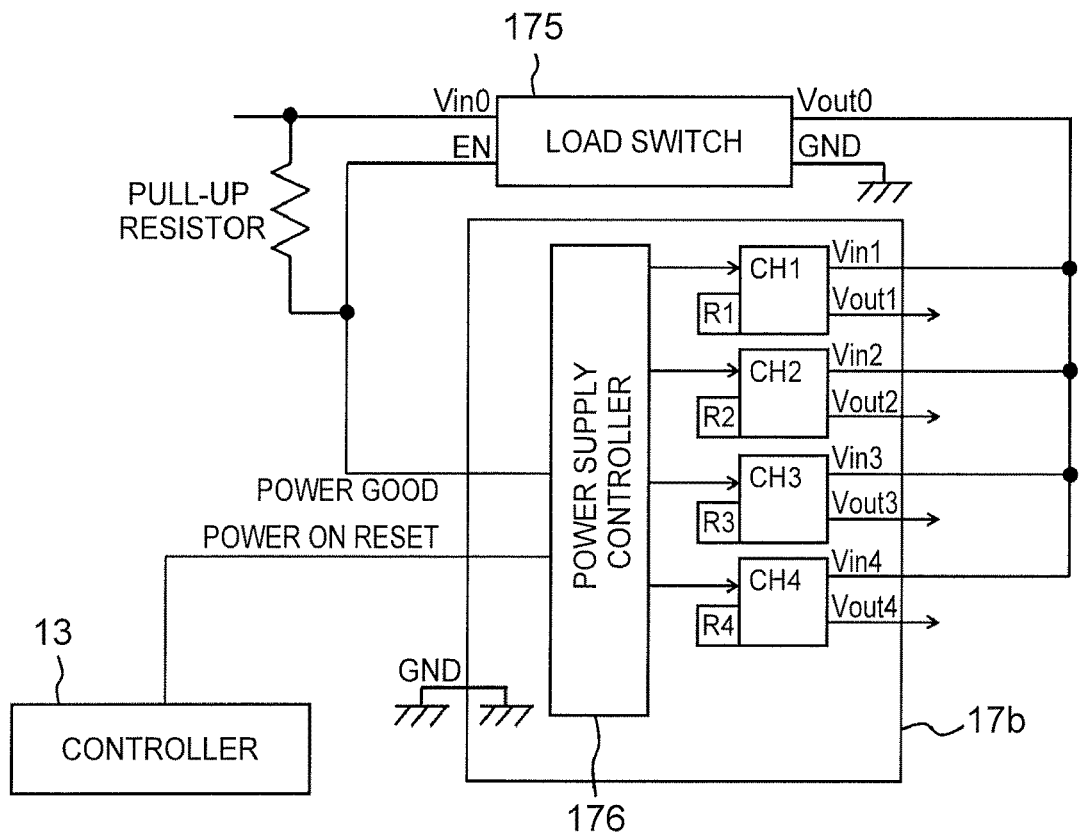
FIG. 6 is a block diagram of a second embodiment illustrating a configuration of a power supply IC and a periphery thereof.

A second embodiment will be described below. The same elements as in the first embodiment will be referenced by the same reference numerals and detailed description thereof will not be repeated. FIG. 6 is a block diagram illustrating a configuration of a power supply IC 17b according to this embodiment and a periphery thereof. In this embodiment, a load switch 175 is disposed independent of the power supply IC 17b (outside the package of the power supply IC 17b, that is, independent of the power supply IC 17b) and the output Vout0 of the load switch 175 is connected to the inputs of the power supply channels CH of the power supply IC 17b. The power supply IC 176 and the load switch 175 constitutes a power supply circuit.

In this embodiment, the power supply IC 17b includes a POWER GOOD output. The POWER GOOD output is a signal indicating whether a protection function works in the power supply IC, distinguishes whether the protection function works or not, for example, by "LOW" and "HIGH" or "LOW" and "Hi-Z," and outputs the value.

The POWER GOOD output of the power supply IC 17b is, for example, an open drain output. More specifically, an output circuit in the power supply IC 17b is provided with a field effect transistor (FET), and the drain thereof is drawn out to the outside of the power supply IC 17b without being connected inside the power supply IC 17b.

The POWER GOOD output is pulled up to the input Vin0 side of the load switch 175. More specifically, the POWER GOOD output is connected to the input side of the load switch 175 via a pull-up resistor.

The load switch 175 includes an enable (EN) terminal. For example, the load switch 175 is turned on when HIGH (H) is input to the EN terminal and is turned off when LOW (L) is input to the EN terminal.

On the other hand, as illustrated in FIG. 6, the power supply IC 17b according to this embodiment includes a POWER ON RESET output. The POWER ON RESET output is designed such that the POWER ON RESET output is changed to LOW to reset the controller 13 (or not to release the reset state of the controller 13), for example, when voltage abnormality occurs in the output of any power supply channel CH of the power supply channels CH1 to CH4 of the power supply IC 17b.

Here, the voltage abnormality refers to, for example, a case in which there is a difference of ±10% or more from a desired voltage value in each power supply channel CH, but this embodiment is not limited thereto. The allowable range of the desired voltage value may be set to ±20% or may be set, for example, to range from −20% to +10%.

In this embodiment, when the OVP function of any of the power supply channels CH1 to CH4 works, the POWER GOOD signal is output as LOW. Accordingly, the load switch 175 is turned off when the input and the output of any power supply channel CH is short-circuited and an overvoltage is input to the output side.

Accordingly, the power supply IC 17b is not supplied with power and it is thus possible to prevent an overcurrent from flowing in a power supply destination of each power supply channel CH. In a design which is short-circuited to the ground when the OVP function works, it is also possible to prevent an overcurrent from continuously flowing in the switching element to damage the power supply IC 17b.

The system of the semiconductor device 1 can be protected by resetting the controller 13 (or maintaining the reset state) when voltage abnormality occurs in any of the power supply channels CH1 to CH4. The power supply IC 17b may be designed to turn off the load switch 175 and to cut the outputs of all the power supply channels CH1 to CH4 when the number of times in which the output exceeds from the allowable range of a desired voltage value in any power supply channel CH become greater than a predetermined number of times, or when a period of voltage abnormality continues more than a predetermined time.

While some embodiments have been described, the embodiments include the following aspects.

The power supply circuit transmits a signal to the controller for resetting the controller when the second power exceeds a first value or less than a third value smaller than the first value or when the third power exceeds a second value or less than a fourth value smaller than the second value.

The power supply circuit turns off the switch when a state in which the second power is equal to or greater than the third value and equal to or less than the first value is not maintained for a first period of time or more or when the state in which the third power is equal to or greater than the fourth value and equal to or less than the second value is not maintained for the first period of time or more.

The power supply circuit turns off the switch and/or stops the supply of power to the semiconductor memory and the controller when the second power exceeds the first value or the third power exceeds the second value.

The power supply circuit transmits a signal to the controller for resetting the controller and/or turns off the switch when the second power or the third power is outside a predetermined range.

While some embodiments of the invention have been described above, the embodiments are provided as only examples and are not intended to limit the scope of the invention. The embodiments may be modified in various forms and may be subjected to various omissions, substitutions, or modifications without departing from the gist of the invention. The embodiments or the modified examples are included in the scope or gist of the invention and are also included in equivalents to the inventions described in the appended claims. Various inventions can be made by appropriately combining two or more elements disclosed in the embodiments. For example, some elements may be deleted from all the elements described in the embodiments. The elements in other embodiments may be appropriately combined.

What is claimed is:

1. A semiconductor device comprising:
   a connector which is connectable to a host;
   a power supply circuit which includes an input portion that is supplied with first power from the host via the connector, an output portion, and a switch that is provided between the input portion and the output portion and that switches to supply the first power to the output portion, and which generates second power and third power from the first power and supplies the second power and the third power to the output portion;
   a semiconductor memory which is supplied with the second power from the output portion; and
   a controller which is supplied with the third power from the output portion and controls the semiconductor memory, wherein
   the power supply circuit further includes a first register which indicates whether or not the second power exceeds a first value and a second register which indicates whether or not the third power exceeds a second value, and
   the power supply circuit is configured to turn off the switch according to the first register or second register to stop the supplying of the first power to the output portion.

2. The semiconductor device according to claim 1, wherein the power supply circuit further includes a first power supply channel which outputs the second power, a second power supply channel which outputs the third power, and a power supply controller which controls the first power supply channel, the second power supply channel, and the switch.

3. The semiconductor device according to claim 2, wherein the first register notifies the power supply controller that the second power exceeds the first value when the second power exceeds the first value and the second register notifies the power supply controller that the third power exceeds the second value when the third power exceeds the second value.

4. The semiconductor device according to claim 3, wherein the power supply controller continuously monitors the first register and the second register.

5. The semiconductor device according to claim 3, wherein the power supply controller monitors the first register and the second register on a predetermined cycle.

6. The semiconductor device according to claim 1, wherein the power supply circuit transmits a signal to the controller for resetting the controller when the second power exceeds the first value or is less than a third value that is less than the first value or when the third power exceeds the second value or is less than a fourth value that is less than the second value.

7. The semiconductor device according to claim 6, wherein the power supply circuit transmits a signal to the controller for releasing a reset state of the controller when the second power exceeds the third value and the third power exceeds the fourth value after the controller has been supplied with the first power from the host.

8. The semiconductor device according to claim 6, wherein the power supply circuit turns off the switch if a state in which the second power is equal to or greater than the third value and equal to or less than the first value is not maintained for at least a first period of time or if a state in which the third power is equal to or greater than the fourth value and equal to or less than the second value is not maintained for at least the first period of time.

9. The semiconductor device according to claim 1, wherein the power supply circuit is disposed between the connector and the semiconductor memory.

10. A semiconductor device comprising:
   a connector which is connectable to a host;
   a switch which includes an input portion that is supplied with first power from the host via the connector and an output portion, and that switches to supply the first power to the output portion;
   a power supply circuit which receives the first power from the output portion or the switch and generates second power and third power from the received first power;
   a semiconductor memory which is supplied with the generated second power from the power supply circuit; and
   a controller which is supplied with the generated third power from the power supply circuit and controls the semiconductor memory, wherein the power supply circuit further includes a first register which indicates whether or not the second power exceeds a first value and a second register which indicates whether or not the third power exceeds a second value, and the power supply circuit further controls the switch according to indications of the first and second registers.

11. The semiconductor device according to claim 10, wherein the power supply circuit further includes a first power supply channel which outputs the second power, a second power supply channel which outputs the third power, and a power supply controller which controls the first power supply channel, the second power supply channel, and the switch.

12. The semiconductor device according to claim 11, wherein the first register notifies the power supply controller that the second power exceeds the first value when the second power exceeds the first value and the second register notifies the power supply controller that the third power exceeds the second value when the third power exceeds the second value.

13. The semiconductor device according to claim 12, wherein the power supply controller unit continuously monitors the first register and the second register.

14. The semiconductor device according to claim 12, wherein the power supply controller monitors the first register and the second register on a predetermined cycle.

15. The semiconductor device according to claim 10, wherein the power supply circuit transmits a signal to the controller for resetting the controller when the second power exceeds the first value or is less than a third value that is less than the first value or when the third power exceeds the second value or is less than a fourth value that is less than the second value.

16. The semiconductor device according to claim 15, wherein the power supply circuit transmits a signal to the controller for releasing a reset state of the controller when the second power exceeds the third value and the third power exceeds the fourth value after the controller has been supplied with the first power from the host.

17. The semiconductor device according to claim 15, wherein the power supply circuit turns off the switch if a state in which the second power is equal to or greater than the third value and equal to or less than the first value is not maintained for at least a first period of time or if a state in which the third power is equal to or greater than the fourth value and equal to or less than the second value is not maintained for at least the first period of time.

18. The semiconductor device according to claim 10, wherein the power supply circuit is disposed between the connector and the semiconductor memory.

* * * * *